United States Patent [19]

Matsuno

[11] Patent Number: 4,638,242
[45] Date of Patent: Jan. 20, 1987

[54] METHOD AND DEVICE FOR MEASURING INSULATION DETERIORATION OF ELECTRIC LINE

[75] Inventor: Tatsuji Matsuno, Samukawa, Japan

[73] Assignee: Toyo Communication Equipment Co., Ltd., Kanagawa, Japan

[21] Appl. No.: 522,175

[22] PCT Filed: Jul. 1, 1982

[86] PCT No.: PCT/JP82/00251

§ 371 Date: Aug. 4, 1983

§ 102(e) Date: Aug. 4, 1983

[30] Foreign Application Priority Data

Jul. 1, 1981 [JP] Japan ................................ 56-103718

[51] Int. Cl.⁴ ............................................ G01R 27/00
[52] U.S. Cl. .................................... 324/51; 324/57 R
[58] Field of Search ............ 324/51, 52, 57 R, 57 SS, 324/61 R; 364/480–485

[56] References Cited

U.S. PATENT DOCUMENTS

| | | | |
|---|---|---|---|
| 2,971,152 | 2/1961 | Ranky | 324/57 R |
| 3,155,900 | 11/1964 | Hankgn | 324/57 R |
| 3,320,946 | 5/1967 | Dethloff | 324/57 R |
| 3,419,799 | 12/1968 | Papadeas | 324/57 R |
| 3,543,148 | 11/1970 | Martin | 324/57 R |
| 3,968,427 | 7/1976 | Sharrit | 324/57 SS |
| 4,142,143 | 2/1979 | Daniel | 324/57 R |
| 4,370,611 | 1/1983 | Gregory | 324/57 SS |

Primary Examiner—Reinhard J. Eisenzopf
Assistant Examiner—Jose M. Solis
Attorney, Agent, or Firm—Spensley Horn Jubas & Lubitz

[57] ABSTRACT

A method and device for measuring or detecting insulation resistance of an electric line in an operating state is disclosed. At least two low frequency measuring signals of mutually different frequencies are applied to the electric line by electromagnetic induction or series coupling, and the insulation condition of the electric line is measured by detecting the effective values of the low frequency measuring signals having returned to the earthline for each frequency. When the two effective component values coincide, those values are taken as a measured value of insulation resistance, while when the values do not coincide, the effective component values are detected using at least one low frequency voltage of further different frequency, the insulation resistance of the electric line is calculated based on a plurality of those detected values, whereby not only the insulation resistance of the circuit to be equivalently represented by a parallel circuit of resistance and capacitance, but also the presence and further value of insulation deterioration to be equivalently represented by a series circuit of resistance and capacitance, can be calculated.

7 Claims, 6 Drawing Figures

METHOD AND DEVICE FOR MEASURING INSULATION DETERIORATION OF ELECTRIC LINE

BACKGROUND OF THE INVENTION

1. Field of the Invention

The present invention relates to a method and device for measuring insulation deterioration of electric line with load, and in particular to an improved method and device for measuring and/or monitoring insulation resistance of electric line in an operating state.

2. Description of the Prior Art

Generally, a high voltage insulation resistance measuring instrument (hereinafter called megger) has been used for measuring insulation resistance of electric line in which a dc voltage is applied to the electric line, and insulation resistance is measured from a current returned to a grounding conductor. However, the insulation resistance measuring method employing the megger has the following drawbacks:

(1) Since high dc voltage is applied, a device or an element of low dielectric strength typically made of a semiconductor provided in the line as a load or the like, would be destroyed. Accordingly, the measurement should be made while disconnecting such load each time of measurement.

(2) Recently, it has become known that there is an insulation deterioration of electrical line with load, which is equivalently represented by the series coupling of resistance and capacitance in addition to one that is equivalently represented by the parallel coupling of resistance and capacitance which has been known before. However, since the megger employs a dc voltage, such resistance as represented by series coupling cannot be measured.

The various methods and devices for measuring and/or monitoring insulation resistance of electric line in operating states have been proposed but the above problem (2) has not been solved. Typical of those methods include a first method wherein a low frequency voltage is applied to electric line through electromagnetic induction via a class two grounding conductor for the transformer by such means as passing the grounding conductor through the core of the oscillation transformer of an oscillator oscillating a low frequency voltage which is a measuring signal or a transformer to which a low frequency voltage is applied, leakage current having returned to the grounding conductor is detected by a zero-phase inverter or the like, and insulation resistance is measured by detecting the effective component of the low frequency component in the leakage current; and a second method wherein the class two grounding conductor for the transformer is disconnected, an oscillator for applying a low frequency voltage being coupled in series in the disconnected part and a resistor for detecting a current having returned to the grounding conductor are connected in series, and insulation resistance is measured by detecting the effective component due to the insulation resistance of the low frequency component in the leakage current obtained across the resistor.

FIG. 1($a$) and FIG. 2 show a prior art method disclosed in Japanese patent publication No. 68290/1978 (filed on Nov. 30, 1976), and FIG. 3 shows another prior art method disclosed in Japanese patent publication No. 7378/1978 (filed on July 9, 1976).

These drawings show the models in which a resistance R and a capacitance C exist in parallel between the line and the earth.

In actual situations, however, series connected $R_1$ and $C_1$ often exist between the line and the earth in addition to the parallel connected R and C as shown in FIG. 1($b$). Hence, in conventional measuring systems based on the circuit models in which such additional elements are neglected, it is impossible to detect separately the effect of $R_1$ and $C_1$, thus involving great potential dangers, especially when $R_1$ becomes small and $C_1$ grows large, for example, when a large quantity of salt adheres to insulators.

FIG. 1($a$) illustrates the above-mentioned first method. A load Z is connected across a transformer T via lines 1 and 2. Though explanation is made here about the case of the single phase two wire circuits of lines 1 and 2 to facilitate the understanding, explanation may be made similarly about the cases of single-phase three-wire circuits and three-phase three-wire circuits, etc. using the principle shown below. In FIG. 1($a$), R is an insulation resistance of the electric line, and C is an earth stray capacity. An earth line (grounding conductor) EL penetrates the core of an oscillation transformer OT which generates a measuring signal of frequency $f_1$ (different from a commercial frequency $f_0$) or the core of a transformer to which a voltage of frequency $f_1$ is applied. A voltage $V_1$ [Volt] (the measuring signal is assumed to be a sine wave though it may be a rectangular wave) of frequency $f_1$ is assumed to be induced in the earth line EL. A zero-phase inverter ZCT through which the earth line EL penetrates is for detecting leakage current. If the detected leakage current is fed to a filter FIL which permits the frequency $f_1$ component and the leakage current of the commercial frequency component is removed, the following output ig of the filter FIL can be obtained.

$$ig = (\sqrt{2}/R)V_1\sin\omega_1 t + \sqrt{2}\,\omega_1 CV_1\cos\omega_1 t \quad (1)$$

where $\omega_1 = 2\pi f_1$.

When the output voltage of an oscillator circuit OSC is $e_1$ [Volt], multiplication by ig with a multiplier MULT will give the following product.

$$ig \times \sqrt{2}\,e_1\sin\omega_1 t = e_1V_1/R + e_1V_1\omega_1 C\sin 2\omega_1 t - (e_1V_1/R)\cos 2\omega_1 t \quad (2)$$

Accordingly, when the dc component of $ig \times \sqrt{2}e_1 \sin\omega_1 t$ is obtained by directing the output of the multiplier MULT through a low-pass filter LPF, the output OUT, i.e., the effective component becomes as follows:

$$OUT = e_1 V_1 / R \quad (3)$$

Accordingly, if $e_1$ and $V_1$ are constant, the insulation resistance may be obtained by substituting the value of OUT.

As already mentioned, it is known that resistance of electric line which can be represented equivalently by the series connection of resistance $R_1$ and capacitance $C_1$ indicated in FIG. 1($b$) in addition to that which can be represented by the parallel connection of resistance R and capacitance C indicated in FIG. 1($a$) (Refer to "Illustrated Electrics" Vol. 20, No. 1, 1979, pp 23). In the first method, if the resistance represented equivalently by the resistance $R_1$ and capacitance $C_1$ is present, a value lower than the value measured by a megger is obtained. In the first method, since no high dc voltage is applied, insulation resistance can be measured in an operating state of electric line without disconnecting the load thus solving the aforementioned problem (1), but leaving unsolved the problem (2), i.e., the problem by the presence or absence of insulation deterioration represented equivalently in the form of series connection of resistance and capacitance and its value.

FIG. 2 illustrates the second method. In this method, a low frequency applying transformer $T_1$ and a leakage current detecting resistor r are connected to the earth line EL in series. The second method shown in FIG. 2 is identical with the first method shown in FIG. 1 except the points in which low frequency is applied and different leakage detection method is used. The second method, however, has the same problem as the first method does.

In addition, there has been proposed a third method wherein commercial supply voltage is directly used without the application of a particular measuring low frequency voltage to electric line, as shown in FIG. 3. However, when this method is adapted to a circuit of single-phase three-wire system, leakage currents generated from two non-grounded circuits cancel each other at an earth line EL because of mutually different current direction and accurate insulation resistance cannot be measured. For this reason, the third method is used only for the single-phase two-wire system. In this case, leakage current to be returned to the earth line corresponds to a value obtained by replacing $\omega_1$ with $\omega_0$ ($\omega_0 = 2\pi f_0$, $f_0$ = commercial frequency) in Eq. (1) and $V_1$ with line voltage $V_0$. If a voltage obtained by dividing a voltage obtained from lines 1 and 2 with a transformer $T_2$ is $e_0$ [Volt], the output of a multiplier MULT is equal to that to be obtained by substituting $e_0V_0$ for $e_1V$ of Eq. (2) and $\omega_0$ for $\omega_1$. Accordingly, the output of a low-pass filter LPF becomes $e_0V_0/R$. In the case of this method, the same problem as in the cases of the methods shown in FIGS. 1 and 2 arises. The output OUT of the low-pass filter LPF is equal to that obtained by substituting $e_0V_0$ for $e_1V_1$ of Eq. (5) and $\omega_0$ for $\omega_1$, and the output of the low-pass filter LPF at this time does not correspond to the insulation resistance measured with a megger.

Referring to FIG. 1(b), the output ig' of the filter FIL when $R_1$ and $C_1$ exist, can be expressed by the following equation:

$$ig' = (\sqrt{2}\ V_1/R)\sin\omega_1 t + [\sqrt{2}\ V_1/R_1\{1 + (1/\omega_1 C_1 R_1)^2\}]\sin\omega_1 t + \sqrt{2}\ \omega_1 CV_1 \cos\omega_1 t + \sqrt{2}\ \omega_1 C_1 V_1 \cdot [1/\{(\omega_1 C_1 R_1)^2 + 1\}]\cos\omega_1 t \quad (4)$$

When the calculation of $ig' \times \sqrt{2}e_1 \sin \omega_1 t$ is made, the effective component, i.e., the output OUT of the low-pass filter LPF, at this time becomes $$OUT' = [1/R + 1/R_1\{1/(1 + 1/\omega_1^2 C_1^2 R_1^2)\}]e_1 V_1 \quad (5)$$

From Eq. (5), when $\omega_1 C_1 R_1 > 1$, $$OUT' \cong (1/R + 1/R_1)e_1 V_1 \quad (6)$$

when $\omega_1 C_1 R_1 \leq 1$, $$OUT' \cong (1/R)e_1 V_1 \quad (7)$$

When $\omega_1 C_1 R_1 \cong 1$, $$OUT' \cong (1/R + \tfrac{1}{2}R_1)e_1 V_1 \quad (8)$$

From Eq. (5), insulation resistance Rg to be measured from the output OUT' becomes $$1/Rg = 1/R + (1/R_1)\{1/(1 + 1/\omega_1^2 C_1^2 R_1^2)\} \quad (9)$$

However, as can be noted from Eqs. (6), (7), and (8), the value of Rg varies according to the measuring frequency $f_1 = \omega_1/2\pi$. When the measuring frequency $f_1$ is sufficiently high, $1/Rg = 1/R + 1/R_1$ from Eq. (6). On the other hand, when the measuring frequency $f_1$ is increased to a sufficiently high level, ineffective current due to stray capacity including the third term of Eq. (4) will become notably large, calculation error of the multiplier MULT (or a synchronous detector) will become large, and a large error in the calculation of Eq. (5) may result.

For example, insulation resistance Rg to be obtained from Eq. (9) when $R = 500$ kΩ, $R1 = 10$ kΩ, $C = 1$ μF, and $\omega_1/2\pi = 20$ [Hz] will be $$1/Rg = 1/500 \times 10^3 + (1/10 \times 10^3)[1/\{1 + (1/2\pi \times 20 \times 10 \times 10^3 \times 10^{-6})^2\}]$$

$$\cong 1/500 \times 10^3 + (1/10 \times 10)^3\{1/(1 + 0.633)\}$$

$$\cong 1/15.81$$

and $Rg \cong 15.8$ [kΩ] can be obtained. That is, Rg is different from the value 9.8 kΩ in which R and $R_1$ are connected in parallel.

On the other hand, when insulation resistance viewed from the secondary side of the transformer T to the load is measured by a megger, a value according to insulation resistance R, i.e., 500 kΩ in the above example will be measured regardless of $C_1$ and $R_1$ since measurement is made by direct current.

When line voltage is 200 V, commercial frequency current flowing through $R_1$ and $C_1$ can be expressed as follows if commercial frequency $\omega_0/2\pi = 50$ [Hz];

$$200/\sqrt{R^2 + 1/(\omega_0 C_1)^2} = (200/10^3) \times \{1/\sqrt{10^2 + (10/\pi)^2}\} = 20 \times 10^3 \quad (10)$$

That is amperage is about 20 mA and power to be spent at R1 becomes 4 [W] ($= 10 \times 10^3 \times 400 \times 10^{-6}$), whereby the probability of heating is very high rendering a very dangerous situation.

That is, the presence of insulation deterioration such as that represented by $R_1$ and $C_1$ as shown by FIG. 1(b) cannot be detected from only an insulation resistance value given by Eq. (5).

In addition, in the series connection of $C_1$ and $R_1$ shown in FIG. 1(b), insulation deterioration may sometimes be present at more than one point. In such case, the affected points cannot be detected either.

When deterioration of series connection of capacitance $C_1$ and resistance $R_1$ exists at "n" locations, that is, when capacitance Ci and resistance Ri (i=1−n) (not shown) are present in lieu of capacitance $C_1$ and resistance $R_1$ and as many as "n" series circuits consisting of Ci and Ri are arranged in parallel, insulation resistance Rg (n) to be measured can be expressed as follows from Eq. (5).

$$1/Rg(n) = 1/R + \sum_{i=1}^{n} (1/Ri)\{1/1 + (1/\omega i CiRi)^2\} \quad (11)$$

Insulation deterioration occurring at plural points simultaneously as given in Eq. (11) is vary rare, and it is generally assumed that relatively simple insulation deterioration as given by Eq. (9) occurs in most case.

SUMMARY OF THE INVENTION

The present invention features that a method and device for measuring insulation deterioration of electric line with loads in an operating state in which a low frequency signal, i.e., a measuring signal, is applied to an electric line by means of electromagnetic induction of series connection. The measuring signal returned to the earth line is detected, the effective component of the measuring signal is detected and insulation deterioration is measured in the operating state based on the effective component, is characterized by that whether or not insulation deterioration equivalently represented by a series circuit of resistance and capacitance exists (whether or not insulation resistance which cannot be detected by a megger exists) the insulation deterioration is detected through the verification of difference or equality of effective component values to be detected corresponding to two measuring signals of different low frequencies using at least two low frequency signals of mutually different low frequencies as the measuring signals.

When, as a result of the above verification, the effective component values are found to be identical, these effective component values are measured as the insulation resistance of the line (insulation resistance to be detected by a megger).

When, as a result of the verification, these effective component values are found to be different from each other, the presence of insulation deterioration such as that represented by the series coupling of resistance and capacitance is judged. Then, the effective component value corresponding to a measuring signal of different frequency is detected, a specified mathematical operation is executed based on the effective component and the verified two effective components, and the insulation resistance of the line (insulation resistance corresponding to the insulation resistance to be measured by a megger) and the insulation deterioration are separately calculated.

The principle of the measurement of insulation resistance according to the present invention will be explained using mathematical expressions with reference to FIG. 1.

That is, if $Rg_1$ is effective component value detected at measuring frequency $f_1 = \omega_1/2\pi$, $Rg_2$ is that measured at $f_2 = \omega_2/2\pi$, and $Rg_3$ is that measured at $f_3 = \omega_3/2\pi$, then from Eq. (9) (assuming $C_1R_1 = T_1$)

$$1/Rg_1 = 1/R + (1/R_1)[1/\{1 + (1/\omega_1 T_1)^2\}] \quad (12)$$

$$1/Rg_2 = 1/R + (1/R_1)[1/\{1 + (1/\omega_2 T_1)^2\}] \quad (13)$$

$$1/Rg_3 = 1/R + (1/R_1)[1/\{1 + (1/\omega_3 T_1)^2\}] \quad (14)$$

From EQs. (12), (13), and (14) $1/Rg_1 - 1/Rg_2$, $1/Rg_2 - 1/Rg_3$ are calculated. If the ratio is a, then $$a = (1/Rg_1 - 1/Rg_2)/(1/Rg_2 - 1/Rg_3) \quad (15)$$

$$= \{\omega_1^2/(\omega_1^2 + 1/T_1^2) - \omega_2^2/$$

$$(\omega_2^2 + 1/T_1^2)\}/\{\omega_2^2/$$

$$(\omega_2^2 + 1/T_1^2) - \omega_3^2/(\omega_3^2 +$$

$$1/T_1^2)\}$$

Finding $1/T_1^2$ from Eq. (15), $$1/T_1^2 = \{\omega_3^2(\omega_1^2 - \omega_2^2) - \quad (16)$$

$$a\omega_1^2(\omega_3^2 - \omega_2^2)\}/$$

$$\{\omega_1^2 - \omega_2^2 - a(\omega_2^2 - \omega_3^2)\}$$

Now, since $1/T_1^2$ was found from Eqs. (12) and (13), $1/R$ can be calculated as follows:

$$1/R_1 = (1/Rg_1 - 1/Rg_2)/\{\omega_1^2/(\omega_1^2 + 1/T_1^2) - \omega_2^2/ \quad (17)$$

$$(\omega_2^2 + 1/T_1^2)\}$$

Accordingly, the second term of Eq. (12) can be calculated as follows:

$$(1/R_1)\{\omega_1^2/(\omega_1^2 + 1/T_1^2)\} = [\{\omega_1^2/(\omega_1^2 + 1/T_1^2)\}/\{\omega_1^2/ \quad (18)$$

$$(\omega_1^2 + 1/T_1^2) - \omega_1^2(\omega_2^2 + 1/T_1^2)\}] \cdot (1/Rg_1 - 1/Rg_2)$$

Similarly, the first term of Eq. (12) can be calculated from Eqs. (12) and (18) as follows:

$$1/R = 1/Rg_1 - (1/R_1)\{\omega_1^2/(\omega_1^2 + 1/T_1^2)\} \quad (19)$$

When $1/Rg_1$, $1/Rg_2$, and $1/Rg_3$ are different from each other, a of Eq. (15) is obtained from these different values, and then $1/T_1^2$ is obtained from Eq. (16) substituting values of a, $\omega_1$, $\omega_2$, and $\omega_3$. Then, from $1/T_1^2$ thus obtained, and $1/Rg_1$, $1/Rg_2$, $\omega_1$ and $\omega_2$, $1/R_1$ is obtained by Eq. (17). From $1/R_1$ thus obtained, and $\omega_1$ and $1/T_1$, Eq. (18) can be set up, and then from Eq. (19) $1/R$ can be obtained. When $T_1$ is obtained from Eq. (10), $C_1 = T_1/R_1$ can be obtained. Impedance X of a circuit of capacitance $C_1$ and resistance $R_1$ connected in series at the commercial frequency is $$X = R_1\sqrt{1 + 1/(\omega_0 T_1)^2} \quad (20)$$

When circuit voltage is determined, current flowing through X and R at the commercial frequency can be calculated, power consumption at $R_1$ and R can be obtained, and prediction of accident due to over heating becomes possible.

That is, insulation resistance to be measured by a megger is the above-noted insulation resistance R, while resistance to be measured by aforementioned three prior art measuring methods is resistance expressed by Eq. (9) or Eq. (11). Accordingly, when it is desired to obtain insulation resistance equivalent to the result of measurement (dc measurement) by a megger using the measuring method of the present invention, Eq. (19), for example, should be used. That is, when detected results $Rg_1$ and $Rg_2$ at measuring frequencies $f_1$ and $f_2$ are equal, $Rg_1$ is equal to R. When $Rg_1$ differs from $Rg_2$, calculation of Eqs. (18) and (19) is performed. The method and device of the present invention are structured using the above-noted principle.

DETAILED DESCRIPTION OF THE PREFERRED EMBODIMENT

With reference to the accompanying drawings embodiments of the insulation deterioration measuring method and device of the present invention will be described in detail.

First, an embodiment of the insulation deterioration measuring method of the present invention will be described referring to FIG. 1.

Figure 1A:
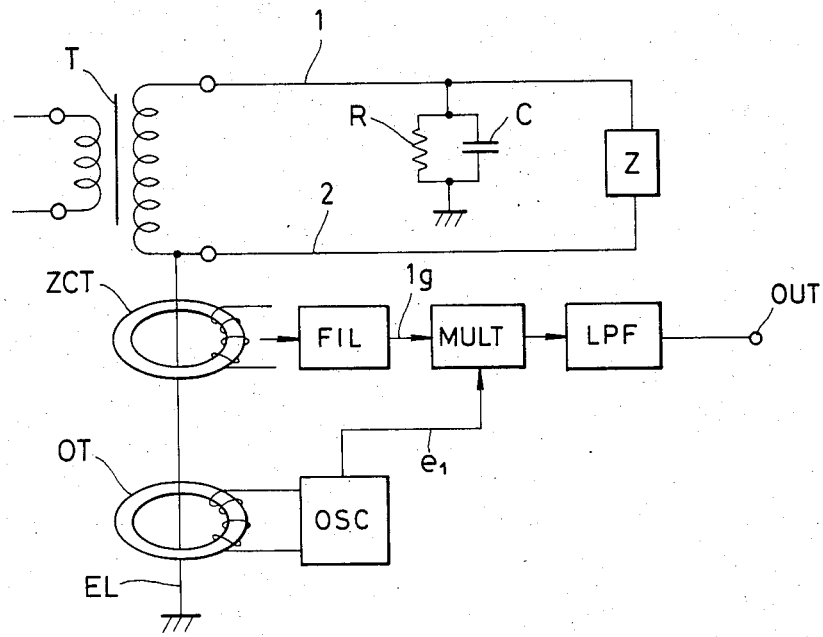
FIGS. 1(a) and 1(b) are circuit models illustrating a first insulation measurement method of prior art and the insulation deterioration measuring method of the present invention.
Figure 1B:
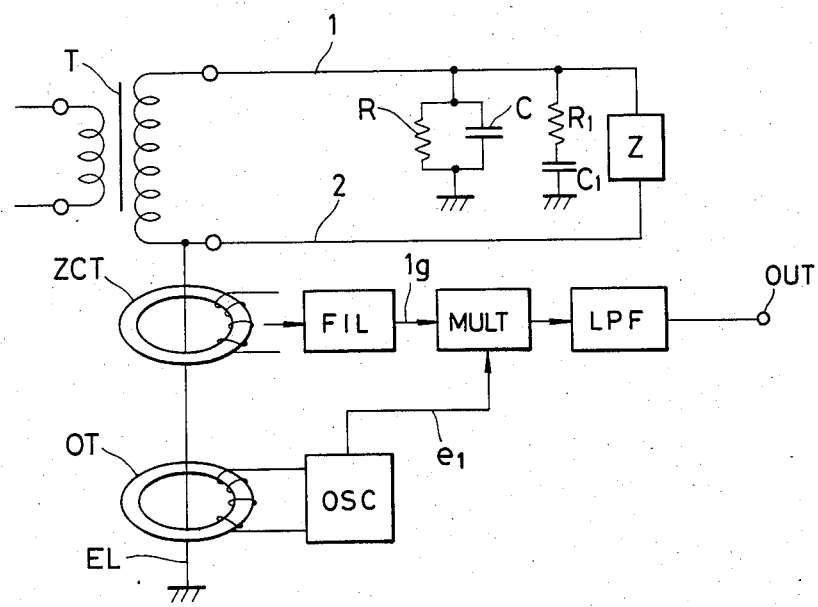
Figure 2:
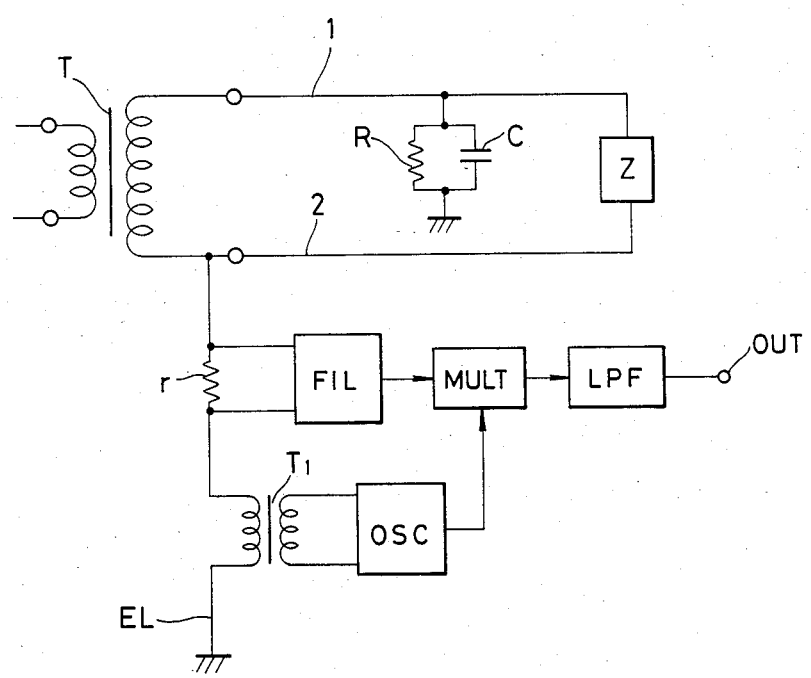
FIG. 2 is a circuit model illustrating a second insulation measurement method of prior art.
Figure 3:
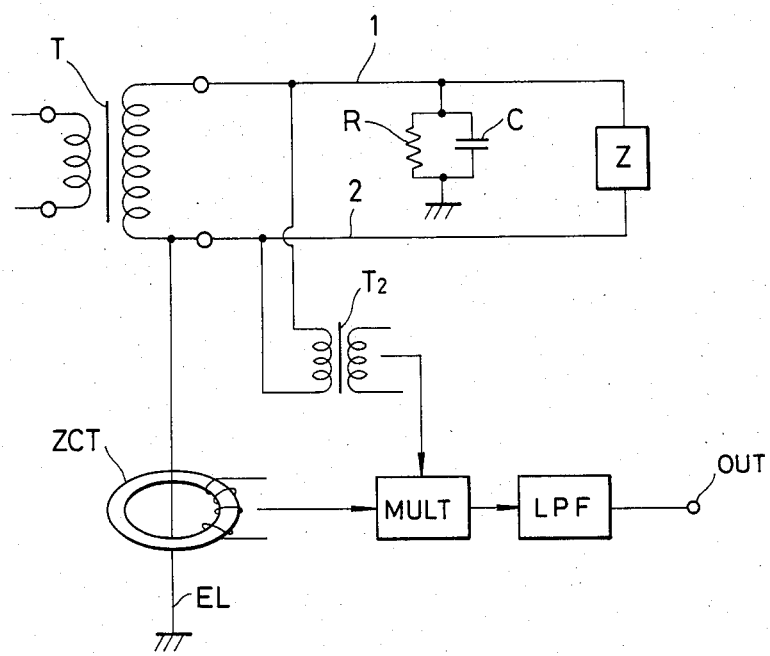
FIG. 3 is a circuit model illustrating a third insulation measurement method of prior art.

In FIG. 1, assuming that the oscillation frequency of an oscillator OSC is $f_1$, the measurement result $R_{g1}$ is obtained from the effective component of a return current to be obtained at the output OUT at that time. Then, the constant of the oscillator OSC is changed so that the oscillation frequency of the oscillator OSC becomes $f_2$, and the measurement result $R_{g2}$ is obtained from the effective component of return current obtained at the output OUT at that time. Then, difference between $R_{g1}$ and $R_{g2}$ is found. When $R_{g1} \cong R_{g2}$, $R_{g1}$ or $R_{g2}$ is judged identical with insulation resistance to be measured with a megger and is output. When $R_{g1} \neq R_{g2}$, the oscillation frequency of the oscillator OSC is switched to $f_3$, and the measurement result $R_{g3}$ is obtained from the effective component of return current obtained at the output OUT at that time. Through the operations of Eqs. (15) to (18) insulation deteriorated element which cannot be measured by a megger can be calculated, and through the operation of Eq. (19) a resistance value equivalent to insulation resistance which can be measured by a megger can be found. In the above embodiment, it is preferable that the center frequency of the filter FIL is switched as the frequency of the oscillator OSC is switched.

Although in the above description the oscillation frequency of a single oscillator is switched, it is also feasible that a plurality of oscillators of different oscillation frequencies are cuased to oscillate and processing is made in parallel providing a plurality of filter-multiplier-low-pass filter systems, or it may also be feasible to use harmonics as $f_1$, $f_2$, and $f_3$ by making the oscillator output waveform a pulse-like waveform.

In addition, while in the above description ZCT and OT allow the earth line to penetrate therethrough, it is apparent that the same result can be obtained when one or both of these allow the cables 1, 2 to penetrate therethrough.

In addition, though for insulation deterioration given in Eq. (11) the three frequencies of $f_1$, $f_2$, and $f_3$ are used when n=1, even when n in Eq. (11) is 2 or more, insulation deterioration can be detected by increasing the kinds of frequency of the measuring low frequency corresponding to the increase of n, i.e., four frequencies when n=2, obtaining the effective component in each case, and performing similar operation based thereon. That is, it is apparent that when insulation deterioration exists at plural number of locations in the series circuit of resistance and capacitance, increasing the number of the kinds of required measuring frequency so as to be adapted to the frequency response of Eq. (11) is only the action to be taken. That is, since n is essentially undertermined, when Ri obtained from Eq. (11) exceeds a predetermined negligibly large resistance value as the number of the kinds of oscillation frequency increases, switching the kinds of oscillation frequency is to be stopped at this point.

Figure 4:
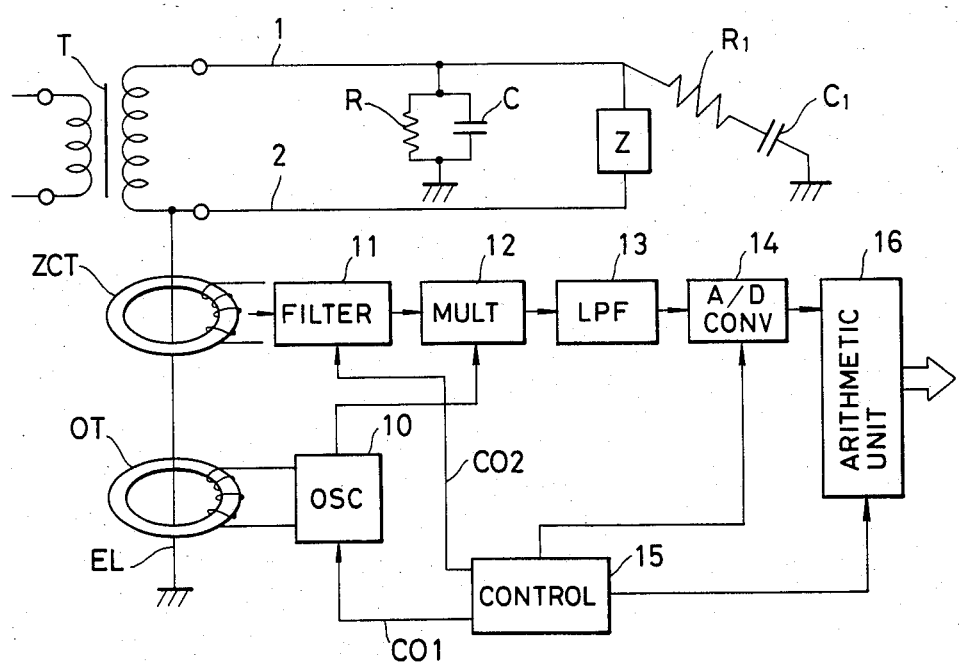
FIG. 4 is a block diagram of an embodiment of insulation deterioration measuring device of the present invention.
Figure 5:
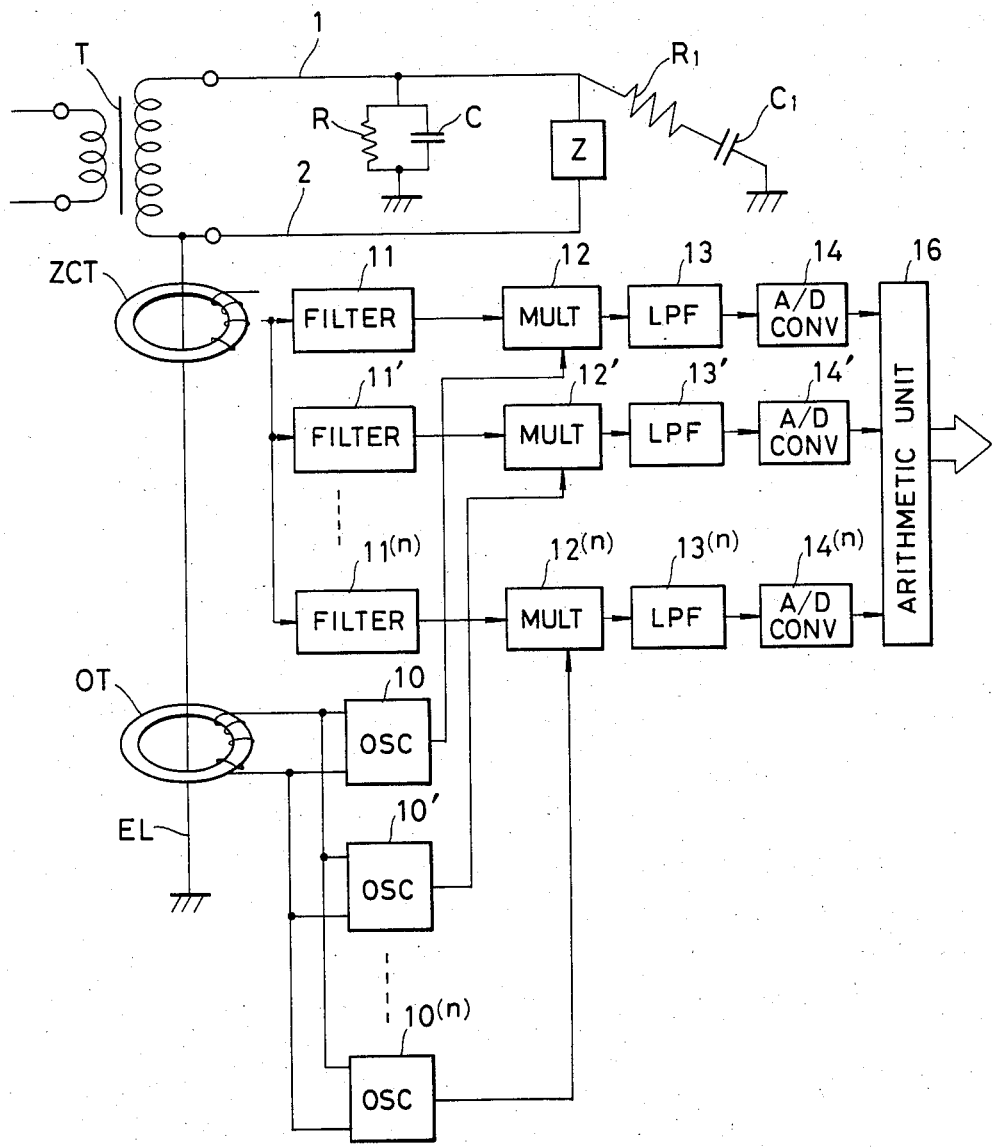
FIG. 5 is a block diagram of an another embodiment of the present invention.

Referring now to FIGS. 4 and 5, an embodiment of the insulation deterioration measuring device of the present invention for which the above insulation deterioration measuring method is employed will be described.

In FIG. 4, an oscillator 10 is capable of oscillating a plurality of low frequency signals as it is switched in response to a control signal CO1 from a control circuit 15. A filter circuit 11 is a band pass filter for switching the center frequency in response to a control signal CO2, said center frequency being switched corresponding to the oscillation frequency of the oscillator 10.

First, the control circuit 15 sends out control signals CO1 and CO2 to the oscillator 10 and the filter circuit 11 respectively thereby switching the oscillation frequency of the oscillator 10 to $f_1$ and the center frequency of the filter circuit 11 to $f_1$. As a result, a detection signal corresponding to the return current of frequency $f_1$ is output from the filter circuit 11, this output signal being multiplied by the output of the oscillator 10 at a multiplier 12. The output of the multiplier 12 is fed to a low-pass filter 13. As a result, the effective component of the return current is output from the low-pass filter 13, this effective component Rg1 being converted to a digital signal at an A/D converter 14 and fed to an arithmetic unit 16. Then the control circuit 15 switches the oscillation frequency of the oscillator 10 and the center frequency of the filter circuit 11 to $f_2$. Consequently, the effective component of the return current of frequency $f_2$ is output from the low-pass filter 13, said effective component Rg2 being fed to the arithmetic unit 16. The arithmetic unit 16 first checks if there is difference between Rg1 and Rg2. If Rg1=Rg2, the arithmetic unit 16 judges that there is no insulation deterioration represented equivalently by the series circuit of resistance and capacitance, and outputs the value Rg1 as a measured value of insulation resistance. When Rg1≠Rg2, the control circuit switches the oscillation frequency of the oscillator 10 and the center frequency of the filter circuit 11 to $f_3$, detects the effective component of the return current of frequency $f_3$, and applies the detected value Rg3 to the arithmetic unit 16 via the A/D converter 14. Based thereon, the arithmetic unit 16 performs operation of Eqs. (15) to (19) based on Rg3 and already detected Rg1 and Rg2, and calculates insulation resistance to be given equivalently by the parallel circuit of resistance and capacitance together with insulation deterioration to be given equivalently by the series circuit of resistance and capacitance.

Although in the above embodiment it is designed so as to switch the oscillation frequency of the oscillator 10 and the center frequency of the filter circuit 11 sequentially, an alternative arrangement may be made to execute said operations obtaining return currents of different frequencies at the same time by providing a plurality (as many as n) of oscillators of different oscillation frequencies and, corresponding to the oscillators, a plurality (as many as n) of circuits arrangements consisting of a filter 11, multiplier 12, low-pass filter 13, and an A/D converter 14.

It is also feasible that the oscillator 10 is comprised of an oscillator, typically a rectangular wave oscillator, oscillating waves therefrom including a plurality of higher harmonics, and each higher harmonic is used as a measuring signal. In this case, a single oscillator 10 would suffice.

Furthermore, in the embodiment shown in FIG. 4, when the A/D converter 14 is provided in the previous stage of the filter 11, the filter 11, multiplier 12, and low-pass filter can be of digital type circuits.

INDUSTRIAL APPLICABILITY

As has been described, the present invention not only provides a method for measuring insulation deterioration in an operating state of electric line with loads which is assured to be equivalent to that measured by a megger, which can not be assured by any prior art method, but also the present invention clarifies the above-noted main cause of insulation deterioration, thus increasing making its industrial applicability.

What is claimed is:

1. An improved method for measuring insulation deterioration of an electric line in which a measuring signal of low frequency is applied to the electric line, an effective component of the measuring signal returned to an earth line of the electric line is measured in an operating state of said electric line, and the insulation resistance of said electric line is calculated based on said effective component, said improved method characterized in that
   first applying low frequency signals of at least two mutually different frequencies as plural said measuring signals;
   measuring, in an operating state of said electric line, a corresponding effective component returned to an earth line of each of said low frequency measuring signals of at least two mutually different frequencies;
   determining whether or not insulation resistance values calculated corresponding to said corresponding measured effective components of said at least two measuring signals of mutually different frequencies are identical;
   wherein if determination of identicality of insulation resistance value is made then, the absence of insulation deterioration in said electric line being established, adopting said identical insulation resistance values as the true and actual insulation resistance of said electric line else if determination of identicality of insulation resistance is not made then second applying at least one further measuring signal of a further different low frequency, then executing a specified mathematical operation based on the corresponding measured effective components of the measuring signals of different frequencies, in order to separately calculate both the insulation resistance of said electric line and an insulation deterioration of said electric line.

2. The improved method of measuring insulation resistance of an electric line as set forth in claim 1 wherein said measuring signal is a voltage signal of low frequency.

3. The improved method of measuring insulation resistance of an electric line as set forth in claim 1 wherein said measuring signal is applied to said electric line by electromagnetic induction or series coupling.

4. The improved method of measuring insulation resistance of an electric line as set forth in claim 1 wherein said measuring signal is applied to said electric line via the earth line of a transformer connected to said electric line and said returned measuring signal is detected via said earth line.

5. The improved method of measuring insulation resistance of an electric line as set forth in claim 1 wherein the specified mathematical operation executed based on the corresponding effective components of the measuring signals of all different frequencies in order to calculate the insulation resistance of said electric line when determination of identicality of insulation resistance at said at least two measuring signals was not made is further defined as the mathematical operation:

$$1/R = 1/R_{g1} - (1/R_1)\{\omega_1^2/(\omega_1^2 + 1/T_1^2)\}$$

derivable from $$(1/R_1)\{\omega_1^2/(\omega_1^2 + 1/T_1^2)\} = [\{\omega_1^2/(\omega_1^2 + 1/T_1^2)\}/\{\omega_1^2/(\omega_1^2 + 1/T_1^2) - \omega_1^2/(\omega_2^2 + 1/T_1^2)\}] \cdot (1/R_{g1} - 1/R_{g2})$$

and from $$1/T_1^2 = \{\omega_3^2(\omega_1^2 - \omega_2^2) - a\omega_1^2(\omega_3^2 - \omega_2^2)\}/\{\omega_1^2 - \omega_2^2 - a(\omega_2^2 - \omega_3^2)\}$$

and from $$a = (1/R_{g1} - 1/R_{g2})/(1/R_{g2} - 1/R_{g3})$$

where
$R_{g1}$ = insulating resistance calculated at frequency $f_1 = \omega_1/2\pi$
$R_{g2}$ = insulating resistance calculated at frequency $f_2 = \omega_2/2\pi$
$R_{g3}$ = insulating resistance calculated at frequency $f_3 = \omega_3/2\pi$
$f_1$ = frequency of first applied measuring signal
$f_2$ = frequency of second applied measuring signal
$f_3$ = frequency of third applied measuring signal
$\omega_1 = 2\pi f_1$
$\omega_2 = 2\pi f_2$
$\omega_3 = 2\pi f_3$.

6. The improved method of measuring insulation resistance of an electric line as set forth in claim 1 wherein the specified mathematical operation executed based on the corresponding effective components of the measuring signals of all different frequencies in order to calculate the insulation deterioration of said electric line when determination of identicality of insulation resistance at said at least two measuring signals was not made is further defined as:
   when deterioration of series connection of capacitance $C_1$ and resistance $R_1$ exists at "n" locations, that is, when abnormal capacitance Ci and resistance Ri (i=1−n) are present in lieu of normal capacitance $C_1$ and resistance $R_1$, then the insulation deterioration at such "n" locations is given relative to measured insulation resistance $Rg(n)$ as the mathematical operation $$1/Rg(n) = 1/R + \sum_{i=1}^{n} (1/Ri)\{1/1 + (1/\omega CiRi)^2\}$$

where to solve this equation, first recognize that $Rg_1$ is insulation resistance measured at measuring frequency $f_1 = \omega_1/2\pi$, $Rg_2$ is that measured at $f_2 = \omega_2/2$, and $Rg_3$ is that measured at $f_3 = \omega_3/2\pi$, then $$1/Rg_1 = 1/R + (1/R_1)$$
$$[1/\{1 + (1/\omega_1 T_1)^2\}]$$
$$1/Rg_2 = 1/R + (1/R_1)$$
$$[1/\{1 + (1/\omega_2 T_1)^2\}]$$
$$1/Rg_3 = 1/R + (1/R_1)$$
$$[1/\{1 + (1/\omega_3 T_1)^2\}]$$

from calculatable quantities $1/Rg_1 - 1/Rg_2$ and $1/Rg_2 - 1/Rg_3$ define ratio a $$a = (1/Rg_1 - 1/Rg_2)/(1/Rg_2 - 1/Rg_3)$$

also then $$1/T_1^2 = \{\omega_3^2(\omega_1^2 - \omega_2^2) -$$
$$a\omega_1^2(\omega_3^2 - \omega_2^2)\}/$$
$$\{\omega_1^2 - \omega_2^2 - a(\omega_2^2 - \omega_3^2)\}$$

by substituting values of a, $\omega_1$, $\omega_2$, and $\omega_3$, then, from $1/T_1^2$ thus obtained, and $1/Rg_1$, $1/Rg_2$, $\omega_1$ and $\omega_2$, $1/R_1$ is obtained by $$1/R_1 = (1/Rg_1 - 1/Rg_2)/\{\omega_1^2/(\omega_1^2 + 1/T_1^2) - \omega_2^2/(\omega_2^2 + 1/T_1^2)\}$$

from $1/R_1$ thus obtained, and $\omega_1$ and $1/T_1$ set up the following equation:

$$(1/R_1)\{\omega_1^2/(\omega_1^2 + 1/T_1^2)\} = [\{\omega_1^2/(\omega_1^2 + 1/T_1^2)\}/\{\omega_1^2/$$

-continued $$(\omega_1^2 + 1/T_1^2) - \omega_1^2/(\omega_2^2 + 1/T_1^2)\}] \cdot (1/Rg_1 - 1/Rg_2)$$

then calculate $$1/R = 1/Rg_1 - (1/R_1)\{\omega_1^2/(\omega_1^2 + 1/T_1^2)\}$$

permitting the solution of the first given equation where $Rg_1$ = insulating resistance calculated at frequency $f_1 = \omega_1/2\pi$
$Rg_2$ = insulating resistance calculated at frequency $f_2 = \omega_2/2\pi$
$Rg_3$ = insulating resistance calculated at frequency $f_3 = \omega_3/2\pi$
$f_1$ = frequency of first applied measuring signal
$f_2$ = frequency at second applied measuring signal
$f_3$ = frequency at third applied measuring signal
$\omega_1 = 2\pi f_1$
$\omega_2 = 2\pi f_2$
$\omega_3 = 2\pi f_3$.

7. An improved method for measuring insulation resistance of electric line in which a measuring signal of low frequency is applied to the electric line, an effective component of the measuring signal returned to an earth line of the electric line is measured in an operating state of said electric line, and the insulation resistance is calculated based on said effective component, said improved method characterized in that low frequency signals of at least two mutually different frequency are first applied to the electric line as said measuring signal;

effective components returned to an earth line of each said low frequency measuring signals are measured;

whether or not effective components values calculated corresponding to said measuring signals of said at least two mutually different frequencies are identical is determined, and if the two insulation resistance values are identical, then these values are adopted as the insulation resistance of the electric line;

else if the two insulation resistance values are different, then a predetermined operation is executed based on an effective component value calculated corresponding to a measuring signal of further different frequency together with said two effective component values so as to obtain the insulation resistance of the electric line.

* * * * *